United States Patent
Nagayama et al.

[11] Patent Number: 5,997,757
[45] Date of Patent: *Dec. 7, 1999

[54] METHOD OF FORMING CONNECTION HOLE

[75] Inventors: Tetsuji Nagayama; Masaki Minami, both of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/653,453

[22] Filed: May 24, 1996

[30] Foreign Application Priority Data

May 29, 1995 [JP] Japan .............................. P07-130318
Feb. 16, 1996 [JP] Japan .............................. P08-029599

[51] Int. Cl.$^6$ .......................... H01L 21/71; H01L 21/308; H01L 21/768; H01L 21/769
[52] U.S. Cl. ........................... 216/38; 438/702; 438/740; 428/515
[58] Field of Search .............................. 428/515; 216/38; 438/702, 740

[56] References Cited

U.S. PATENT DOCUMENTS

| | | | |
|---|---|---|---|
| 5,286,344 | 2/1994 | Blalock et al. | 156/657 |
| 5,302,240 | 4/1994 | Hori et al. | 156/656 |
| 5,366,590 | 11/1994 | Kadomura | 156/662 |
| 5,369,061 | 11/1994 | Nagayama | 437/228 |
| 5,420,077 | 5/1995 | Saito et al. | 437/228 |
| 5,700,349 | 12/1997 | Tsukamoto et al. | 216/38 |

FOREIGN PATENT DOCUMENTS 8255875  1/1995  Japan .

OTHER PUBLICATIONS

Derwent Abstract Accession No. 92–144449/18, Class U11, JP04032227–A (Matsushita Elec Ind KK)Feb. 4, 1992.
Derwent Abstract Accession No. 95–396777/51, Class L03, JP 07263554–A (NEC Corp) Mar. 25, 1994.
J. Givens, et al., "Selective Dry Etching in a High Density Plasma for 0.5 μm Complementary Metal–Oxide–Semiconductor Technology", Part B, vol. 12, No. 1, Jan. 1, 1994, pp. 427–432, XP 000429051.
"Self–Aligned, Borderless Contact With Nitride Layer", IBM Technical Disclosure Bulletin, vol. 30, No. 8, Jan. 1, 1988, pp. 86–87, XP 000097442.

*Primary Examiner*—Maria Nuzzolillo
*Assistant Examiner*—Leuna Weiner
*Attorney, Agent, or Firm*—Hill & Simpson

[57] ABSTRACT

A method of forming a connection hole, which includes the steps of: laminating an etching stopper film made of a SiN based material and an interlayer insulating film made of a SiOx based material on a substrate in this order; forming an organic film pattern on the interlayer insulating film on the basis of a connection hole pattern; dry-etching the interlayer insulating film using the organic film pattern as a mask while keeping a selection ratio to the etching stopper film; a fourth step of removing a carbon based protective film which is deposited on an exposed surface of the etching stopper film by the dry etching, using an etching reactive system including an oxygen based chemical species; and a fifth step of completing a connection hole by selectively etching the etching stopper film.

2 Claims, 8 Drawing Sheets

METHOD OF FORMING CONNECTION HOLE

BACKGROUND OF THE INVENTION

The present invention relates to a method of forming a connection hole, which is applied to the field of a fine device processing in manufacture of semiconductor devices and the like, and particularly to a method of easily ensuring a sufficient etching selection ratio in a self-aligned contact process using an etching stopper film.

In a manufacturing process for semiconductor devices to which a design rule since the level of 0.3 μm is applied, there occurs a problem that a design size (=hole diameter+design allowance) of a connection hole becomes excessively large when the design allowance of the connection hole is determined in consideration of a variation in alignment with a lower interconnection. The variation in alignment is due to shortage of an aligning performance of a reduction profile exposure system used for lithography. Such a variation is a factor particularly difficult in scale-down among various scaling factors included in semiconductor manufacturing processes, and it is often regarded as the factor exerting an effect on the limitation of the exposure technique more than the resolution.

In view of the foregoing, various kinds of self-aligned contact (SAC) processes capable of eliminating a design allowance for alignment on a photomask have been proposed. In particular, a process using a silicon nitride (SiN) film as an etching stopper film has been mostly examined in terms of an advantage in that an additional exposure process is not required.

This process will be described with reference to FIG. 11.

Figure 11:
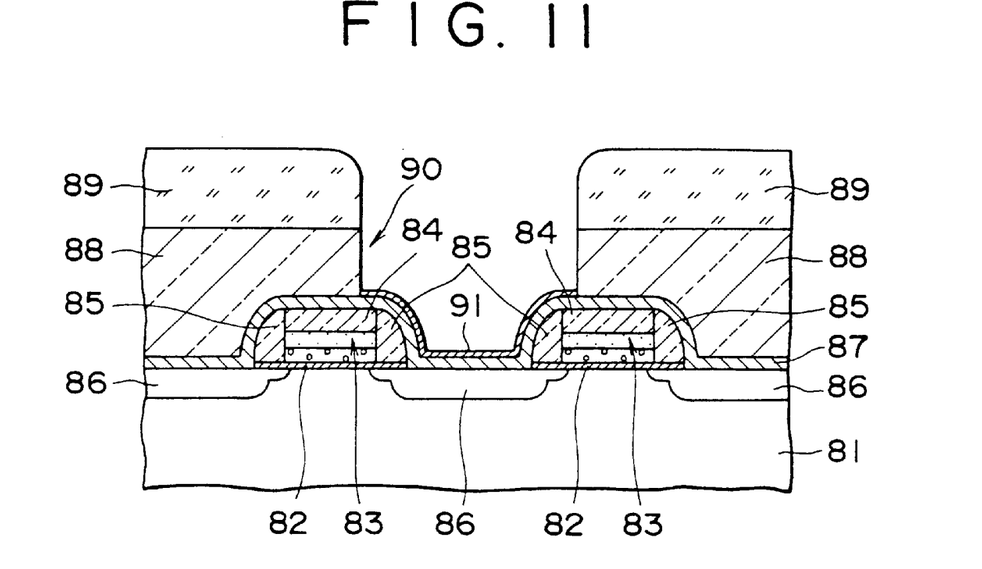
FIG. 11 is a typical sectional view of an example in which a bit line contact of an SRAM on the basis of a related art SAC process, which shows a state in which selective dry etching of a SiOx interlayer insulating film is completed and a FC based protective film is deposited on the surface of a SiN etching stopper film.

FIG. 11 shows a state in which a contact hole for bringing an upper interconnection (bit line) in contact with a substrate between adjacent gate electrodes (word lines) is partially opened in an SRAM memory. The steps until the state shown in FIG. 11 is obtained will be briefly described. Gate electrodes 83 (poly Si/WSix) are formed through a thermal oxidized gate oxide film 82 ($SiO_2$) on the surface of a silicon substrate 81 (Si) previously processed in well formation and element isolation. An upper surface and side surfaces of each gate electrode 83 are respectively covered with an offset oxide film 84 (SiOx) and a side wall 85 (SiOx). Source/drain regions 86 having an LDD structure are formed in surface layer portions of the silicon substrate 81 in self-alignment with the gate electrode 83 and the side wall 85.

A SiN etching stopper film 87 is formed on the entire surface of such a substrate in a conformal manner, and a SiOx interlayer insulating film 88 is deposited thereon and is substantially surface-planarized. A resist pattern 89 (PR) is formed on the SiOx interlayer insulating film 88 by photolithography. The opening of the resist pattern 89 is sufficiently larger than an interconnection space between the adjacent gate electrodes 83.

The SiOx interlayer insulating film 88 is then dry-etched using the resist pattern 89 as a mask in a condition capable of ensuring a sufficient selective ratio to the SiN etching stopper film 87. Here, the etching characteristic of the SiN film will be compared with that of the SiOx film. Both the films are not different so much in energy of chemical bonding of crystal lattices, and they use the basically common species. Moreover, the etching rate by F* (fluorine radical) is slightly larger in the underlying SiN film. For this reason, it has been regarded that highly selective etching of the SiOx film on the SiN film is extremely difficult. In recent years, however, so-called high density plasma sources capable of achieving an ion current density of 5 $mA/cm^2$ or more, such as an ECR plasma, induction coupling plasma (ICP) and helicon wave plasma have been variously proposed, and the above highly selective etching of the SiOx film has been performed using such a high density plasma source. Specifically, the above dry etching is performed using a plasma of a fluorocarbon based gas and the selection ratio is ensured by depositing a fluorocarbon (FC) based polymer on the surface of the underlying layer so as to form a FC based protective film 91. The reduction in etching rate due to deposition of the FC protective film is compensated by production of a large amount of an etching species in the high density plasma.

In the case where the etching selection ratio in the above dry etching is sufficiently large, the etching of the SiOx interlayer insulating film 88 is rapidly reduced in its etching rate when reaching the SiN etching stopper film 87, so that the erosion of the offset oxide film 84 and the side wall 85 is prevented. FIG. 11 shows the state in which the above steps are completed. After that, the SiN etching stopper film 87 is selectively etched in an etching condition switched for the SiN film, to complete a contact hole 90.

Figure 12:
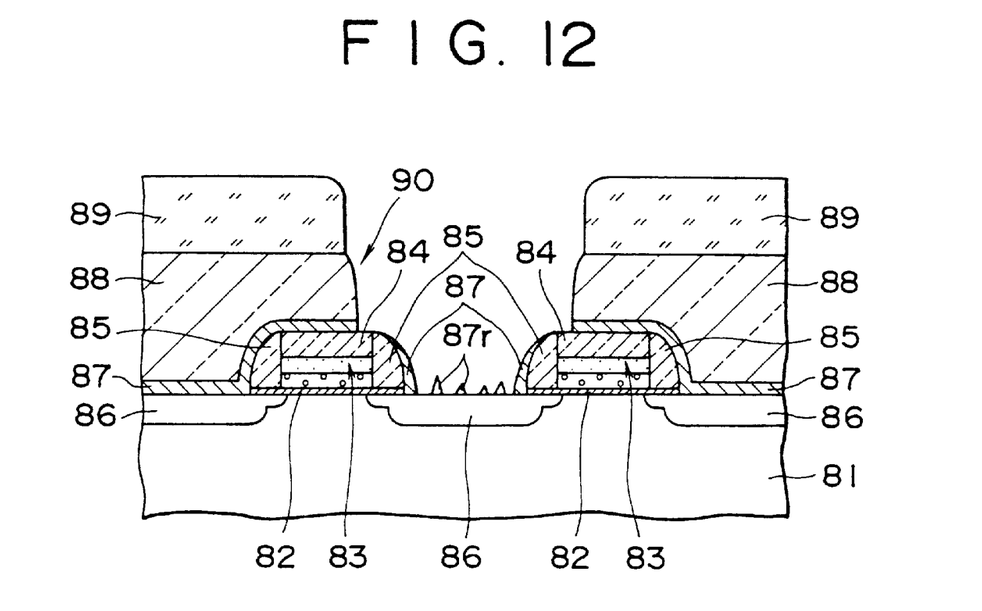
FIG. 12 is a typical sectional view showing a state in which etching residues remain on the bottom of a contact hole after dry etching of the SiN etching stopper film in FIG. 11.

However, if the dry etching for the SiOx interlayer insulating film 88 is desirably performed, it is very difficult to desirably perform the subsequent dry etching for the SiN etching stopper film 87, and in most cases, an etching residue 87r remains on the bottom surface of the contact hole 90. This is because the FC based protective film 91 deposited on the surface of the SiN etching stopper film 87 has a resistance against etching and it functions as a non-uniform etching mask. Such an insulating etching residue 87r reduces an effective contact area and causes a rise in contact resistance or a contact failure, and accordingly it must be removed before formation of an upper interconnection.

Figure 13:
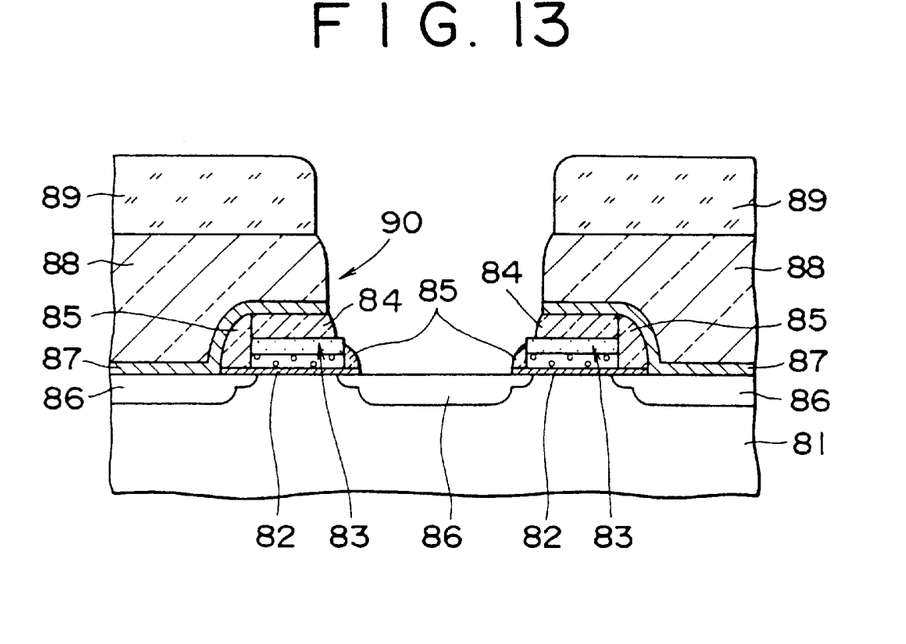
FIG. 13 is a typical sectional view showing a state in which part of a gate electrode is exposed in the contact hole by over-etching of the SiN etching stopper film in FIG. 12.
Figure 14:
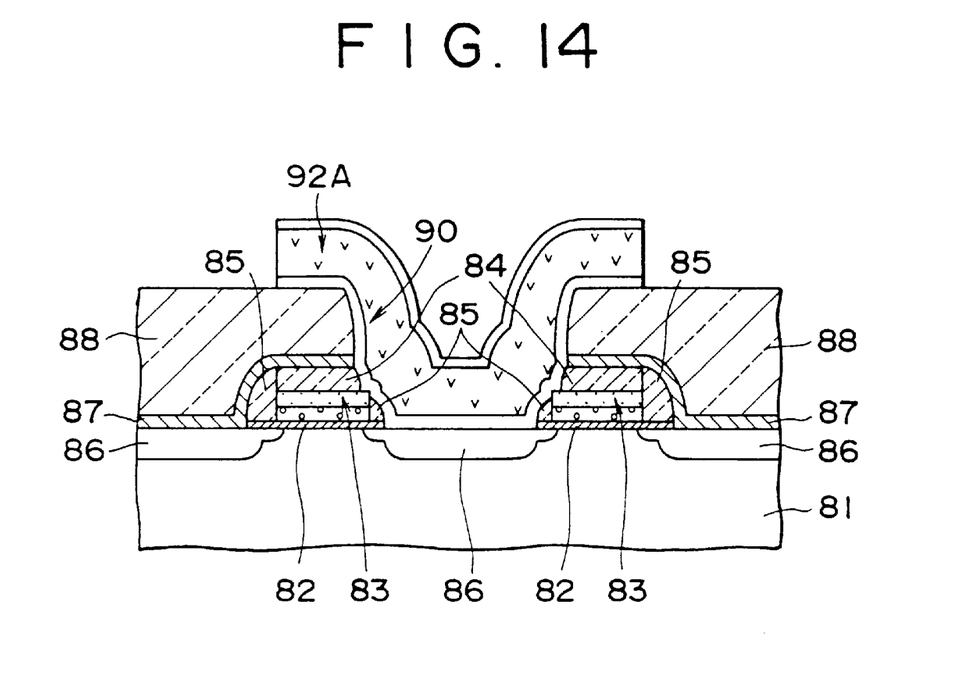
FIG. 14 is a typical sectional view showing a state in which the gate electrode in FIG. 13 is short-circuited to an upper interconnection buried in the contact hole.

To solve such a problem, there may be considered a method of physically removing the FC based protective film 91 by increasing the ion-sputter function upon dry etching of the SiN etching stopper film 87 or removing the etching residue 87r by excessive over-etching. Such a method, however, is disadvantageous in that the offset SiOx film 84 and the side wall 85 are eroded as shown in FIG. 13, to cause a fear that the gate electrode 83 is partially exposed in the contact hole 90. When the contact hole 90 is covered with an upper interconnection 92 (Al) in such a state, the upper interconnection 92 is short-circuited with the gate electrode 83 as shown in FIG. 14.

In the related art SAC process using an SiN based film as the etching stopper film, as described above, it degrades the reliability of the process that the FC based protective film having a high resistance against etching and necessary for ensuring a high selection ratio to the SiN film cannot be sufficiently removed in the subsequent process.

SUMMARY OF THE INVENTION

An object of the present invention is to provide a method of forming a connection hole, which is capable of realizing a SAC process having a high reliability.

To achieve the above object, according to the present invention, there is provided a method of forming a connection hole, including the steps of laminating an etching stopper film made of a SiN based material (hereinafter, referred to as "SiN etching stopper film") and an interlayer insulating film made of a SiOx based material (hereinafter, referred to as "SiOx interlayer insulating film") on a substrate in this order, and opening a connection hole in the laminated film using an organic film pattern as a mask, wherein a carbon based protective film deposited on an exposed surface of the SiN etching stopper film upon etching of the SiOx interlayer insulating film is removed before or during the subsequent etching of the SiN etching stopper film using an etching reactive system including an oxygen based chemical species. In addition, the above laminated film is typically used for an SAC process.

When the three steps, dry etching of the SiOx interlayer insulating film, removal of a carbon based protective film, and etching of the SiN etching stopper film are all performed as a plasma process, it is advantageous in terms of improvement in throughput and particle management that at least continuous two steps of the three steps are performed in a state in which the substrate is held in the same plasma chamber. In particular, when the above etching is performed in a state in which a substrate (wafer) is mounted on a substrate stage (wafer stage) having a single electrode type electrostatic chuck, the removal of the carbon based protective film can be performed in such a manner as to serve as the removal of residual charges of the single electrode type electrostatic chuck. Even when the two steps, dry etching of the SiOx interlayer insulating film and the simultaneous etching removal of the carbon based protective film and the SiN etching stopper film are performed as the plasma process, these two steps can be performed in the same plasma chamber.

BRIEF DESCRIPTION OF THE DRAWINGS

These and other objects of the invention will be seen by reference to the description, taken in connection with the accompanying drawings, in which.

DETAILED DESCRIPTION OF THE PREFERRED EMBODIMENTS

A main feature of the present invention is to remove a carbon based protective film using a plasma of an active species which is mainly composed of an oxygen based chemical species. The carbon based protective film is produced by polymerization of a fluorocarbon based compound typically used for dry etching of a SiOx interlayer insulating film or a chemical species which is a discharge decomposition product of the fluorocarbon based compound. In other words, the carbon based protective film is substantially a fluorocarbon (FC) based polymer. The removal of the carbon based protective film can be thus performed using a plasma of an active species which is mainly composed of an oxygen based chemical species, particularly, O* (oxygen radical). This is convenient for the process because the removal of an organic film pattern represented by a resist pattern is performed by $O_2$ plasma ashing. Alternatively, the removal of the FC protective film may serve as the function of resist ashing. The plasma can be excited by discharging a gas at least containing $O_2$. In the case where the carbon based protective film is removed together with the SiN etching stopper film, an etching species for the SiN etching stopper film is required, and in this case, the plasma can be excited by discharging a gas containing at least a fluorocarbon based compound and $O_2$.

Incidentally, the removal of the carbon based protective film in the present invention can be performed using an asher; however, such a removal requires a complicated procedure of carrying a wafer W from an etcher once after etching of a SiOx interlayer insulating film, carrying the wafer W into an asher for ashing, and carrying the wafer W from the asher into an etcher for etching the SiN etching stopper film. This procedure not only increases an opportunity of particle contamination of the wafer W, but also increases an evacuating load of the chamber in the case of using the plasma chamber having a high vacuum degree resulting in the significantly reduced throughput.

A continuous processing using a high density plasma system can be proposed for effectively solving such a problem. Specifically, continuous two or three steps among the steps, dry etching of the SiOx interlayer insulating film, removal of the carbon based protective film, etching of the SiN etching stopper film, or the simultaneous removal of the carbon based protective film and SiN etching stopper film, are performed in one plasma chamber. The typical configuration examples of the high density plasma systems, a magnetic field microwave plasma etcher, induction coupling plasma (ICP) etcher, and helicon wave plasma etcher will be described below with reference to the drawings.

Figure 8:
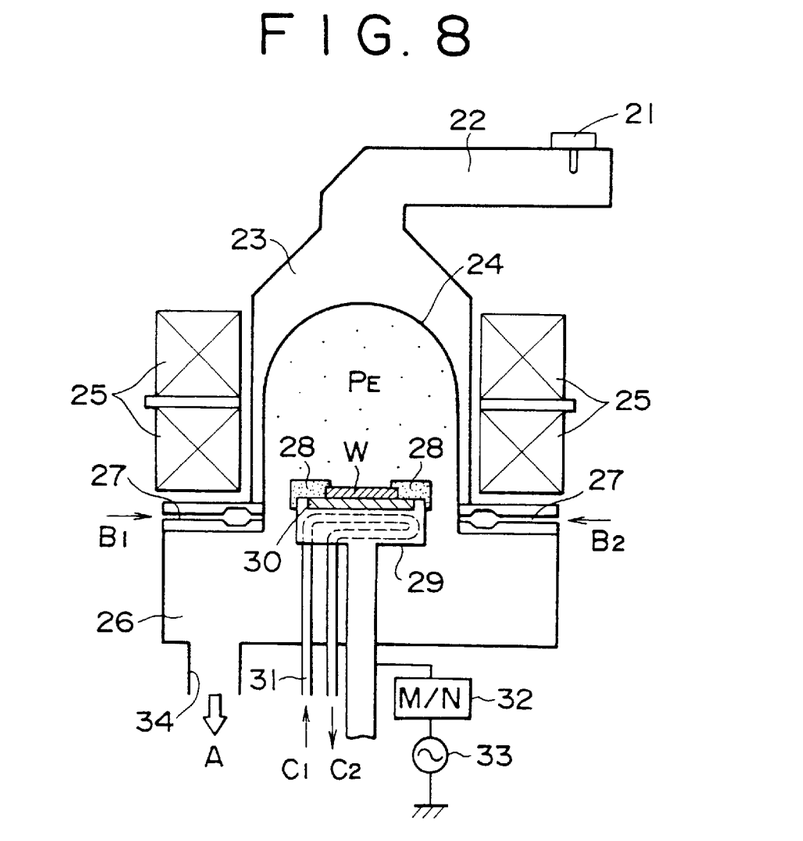
FIG. 8 is a schematic sectional view of a configuration of a magnetic field microwave plasma etcher used for the present invention.

FIG. 8 is a schematic sectional view of a magnetic field microwave plasma etcher. The etcher basically includes a magnetron 21 for generating a microwave of 2.45 GHz; a rectangular waveguide 22 and a circular waveguide 23 for guiding a microwave; a quartz made bell jar 24 for producing an ECR plasma $P_E$ by ECR (electron cyclotron resonance) using the microwave; a solenoid coil 25 capable of achieving a magnetic intensity of $8.75 \times 10^{-2}$ T(875 G), which is wound around the bell jar 24; a sample chamber 26 connected to the bell jar 24 and highly evacuated in the direction of an arrow A through an exhaust port 34; gas introducing pipes 27 for supplying processing gases to the bell jar 24 in the directions of arrow $B_1$ and $B_2$, respectively; a wafer stage 29 for mounting a wafer W; a wafer clamp 28 for clamping the wafer W on the wafer stage 29; an electrostatic chuck 30 buried in the wafer stage 29 for fixing the wafer W on the surface of the wafer stage 29 by a coulomb force; a cooling pipe 31 buried in the wafer stage 29 for cooling the wafer W at a specified temperature by circulating a coolant supplied from a cooling equipment such as a chiller (not shown) in the directions of arrows $C_1$ and $C_2$; and an RF power supply 33 for applying an RF bias to the wafer stage 29, which is connected to the wafer stage 29 through a matching network 32.

Figure 9:
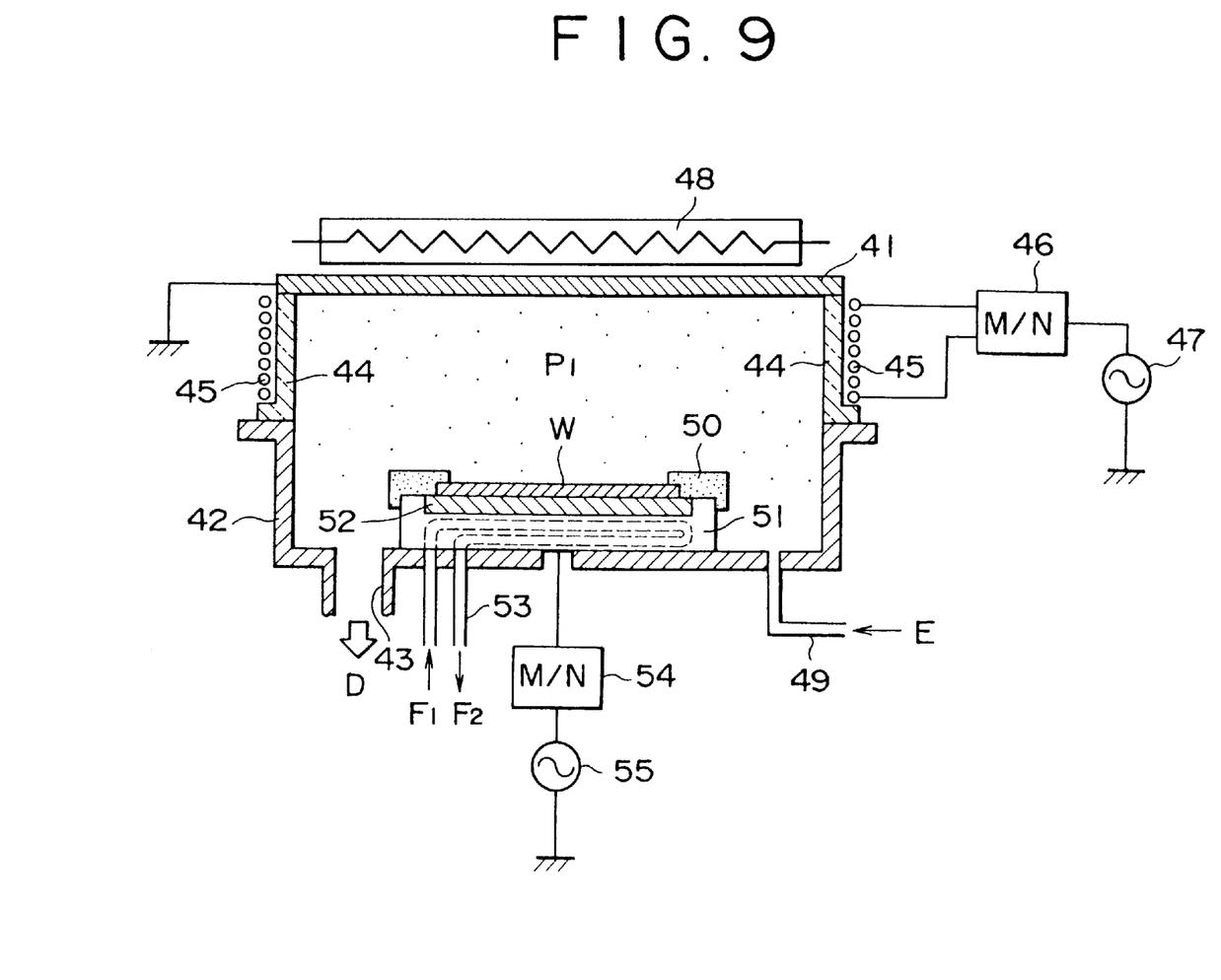
FIG. 9 is a schematic sectional view of a configuration of an induction coupling plasma (ICP) used for the present invention.

FIG. 9 is a schematic sectional view of an induction coupling plasma (ICP). Most of a wall surface of a process chamber 42 of this system is made of stainless steel, and part of the wall surface in the axial direction is taken as a quartz made cylinder 44. A multi-turn antenna 45 is wound around the outer peripheral side of the cylinder 44. An upper lid 41 functioning as an upper electrode is made of polysilicon or single crystal silicon. A plasma exciting RF power supply 47 is connected to the multi-turn antenna 45 through a first matching network (M/N) 46 for impedance matching. The frequency of the plasma exciting RF power supply 47 is set at, for example, 2 MHz.

The interior of the process chamber 42 is highly evacuated in the direction of an arrow D through an exhaust port 43 by an evacuating system (not shown), and it receives a gas necessary for dry etching in the direction of an arrow E through a gas supply pipe 49 opened at a suitable position (bottom surface in FIG. 9) of the process chamber 42.

The process chamber 42 contains a conductive wafer stage 51 electrically isolated from the wall surface thereof. A wafer W (substrate to be processed) is mounted on the wafer stage 51 and is clamped by a wafer clamp 50, to be thus prepared for dry etching. A bias applying RF power supply 55 for applying a substrate bias to the wafer W thereby controlling the energy of ions emitted from an induction coupling plasma Pr is connected to the wafer stage 51 through a second matching network (M/N) 54. Here, the frequency of the bias applying RF power supply 55 is set at, for example, 1.8 MHz. A cooling pipe 53 for circulating a coolant in the directions of arrows $F_1$ and $F_2$ is buried in the wafer stage 51, and an electrostatic chuck 52 for tightly holding the wafer W on the wafer stage 51 is disposed under the wafer stage 51 for increasing the cooling efficiency of the wafer W by the coolant.

Figure 10:
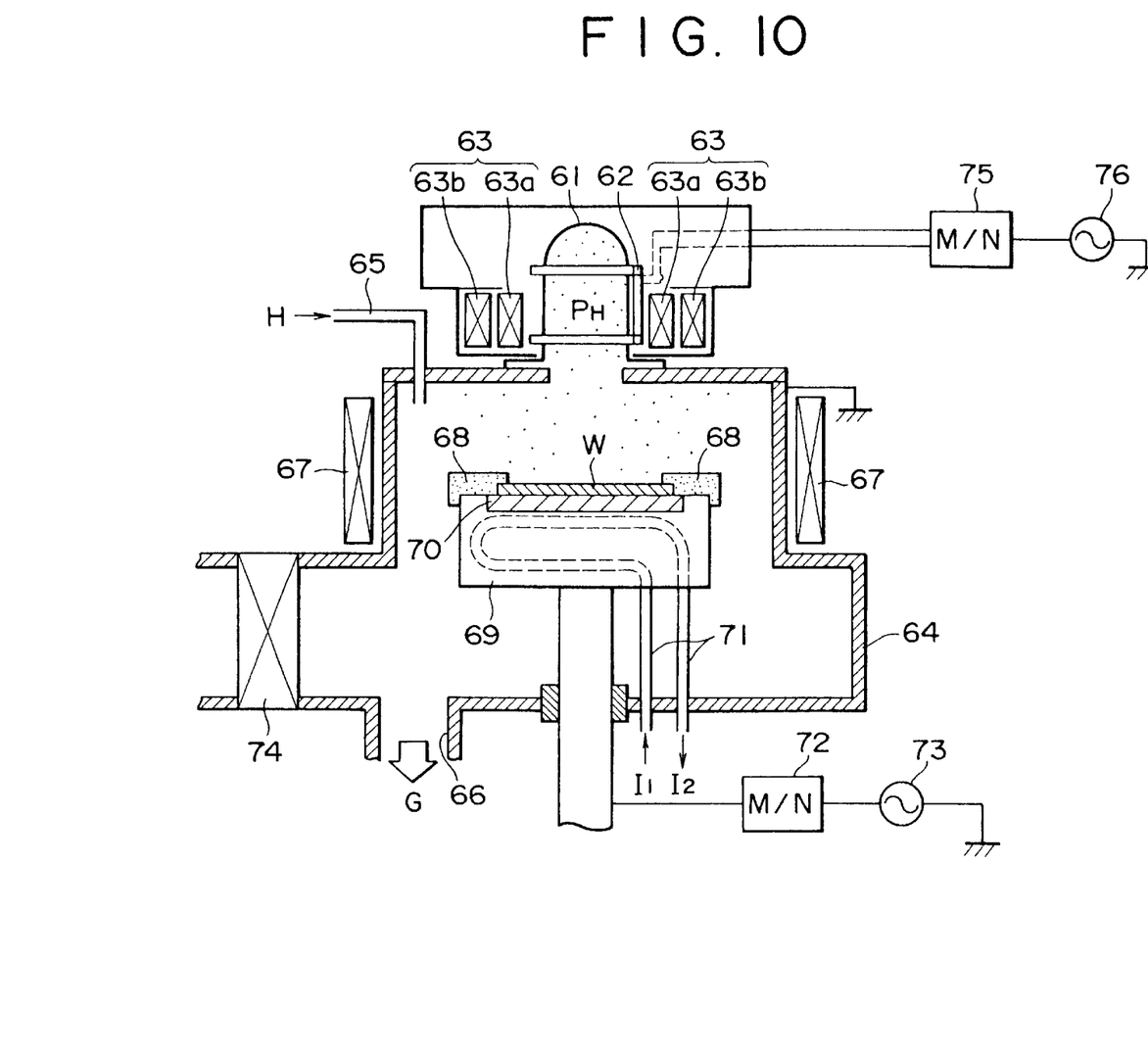
FIG. 10 is a schematic sectional view of a configuration of a helicon wave plasma etcher used for the present invention.

FIG. 10 is a schematic sectional view of a helicon wave plasma etcher. The plasma producing unit of the etcher includes a bell jar 61 for producing a helicon wave plasma $P_H$; an antenna 62, wound around the bell jar 61, for coupling an RF power to the plasma; and a solenoid coil 63, wound around the bell jar 61, for producing a magnetic field in the axial direction of the bell jar 61.

The bell jar 41 is made of a non-conductive material such as quartz. The solenoid coil 63 is composed of an inner peripheral solenoid coil 63a for mainly transmitting a helicon wave, and an outer peripheral solenoid coil 63b for mainly transporting the helicon wave plasma $P_H$. An RF power is applied from a plasma exciting RF power supply 76 to the antenna 62 through a first matching network (M/N) 75 for impedance matching. Here, the frequency of the plasma exciting RF power supply 76 is set at, for example, 13.56 MHz. At this time, when the antenna 62 is of a double loop type for (m=0) mode excitation as shown in FIG. 10, a distance between the upper and lower loops is optimized in accordance with the frequency of a specified helicon wave and currents flow in the loops in the opposed directions. The antenna 62, however, is not limited to the double loop type. For example, the antenna 62 may be of a half-turn type for (m=1) mode excitation.

The bell jar 61 is connected to the sample chamber 64 in such a manner as to extract the helicon wave plasma $P_H$ to the sample chamber 64 along a diverging magnetic field formed by the solenoid coil 63. The side wall surface and the bottom surface of the sample chamber 64 are made of a conductive material such as stainless steel. The interior of the sample chamber 64 is highly evacuated in the direction of an arrow C through an exhaust port 66 by an evacuating system (not shown), and it receives a gas necessary for dry etching in the direction of an arrow H through a gas supply pipe 65 opened in the ceiling portion of the sample chamber 64. The sample chamber 64 is connected at the side wall surface to a load lock chamber (not shown) through a gate valve 74.

The sample chamber 64 contains a conductive sample stage 69 electrically isolated from the wall surface thereof. A wafer W is mounted on the wafer stage 69 and is clamped by a wafer clamp 68, to be thus prepared for dry etching. A cooling pipe 71 for receiving a coolant from a chiller (not shown) and circulating it in the directions of arrows $I_1$ and $I_2$ is buried in the wafer stage 69 for keeping the wafer W at a specified temperature. An electrostatic chuck 70 for tightly holding the wafer W on the wafer stage 69 is disposed under the wafer stage 69 for increasing the cooling efficiency of the wafer W by the coolant. A bias applying RF power supply 73 for applying a substrate bias to the wafer W thereby controlling the energy of ions emitted from the plasma is connected to the wafer stage 69 through a second matching network (M/N) 72. The frequency of the bias applying RF power supply 72 is set at, for example, 400 kHz.

A permanent magnet 67 as an auxiliary magnetic field producing means capable of producing a multi-cusp magnetic field is disposed outside the sample chamber 64 for converging a diverging magnetic field near the wafer stage 69.

In each of three kinds of the etchers described above, continuous processing can be performed by suitably switching the etching condition, for example, the kind of a processing gas, a source power such as a microwave power or RF power, and an RF bias power.

The present invention is suitable for an SAC process. Specifically, in a process in which an electrode pattern having an upper surface and side walls respectively covered with an offset oxide film and a side wall insulating film each of which is made of a SiOx based material is previously formed on a substrate and a connection hole is opened in such a manner that part of the bottom surface thereof covers at least the side wall insulating film, the erosion of the offset insulating film and the side wall insulating film is protected by the SiN etching stopper film. The SiN etching stopper film having completed its protection role is sufficiently removed without generation of any residue. Accordingly, the present invention can achieve a desirable contact without generation of a failure in withstand voltage of an insulating film between an upper interconnection buried in the finished connection hole and the electrode pattern.

The present invention will be more clearly understood with reference to the following examples:

EXAMPLE 1

This example concerns an SAC process in which a bit line extraction electrode of an SRSM is brought in contact with a substrate between two words lines. A SiOx interlayer insulating film is dry-etched by a magnetic field microwave plasma etcher, and a FC based protective film deposited on an exposed surface of a SiN etching stopper film is removed by an asher. After that, a SiN etching stopper film is dry-etched using another magnetic field microwave plasma etcher. This process will be described with reference to FIGS. 1 to 5.

Figure 1:
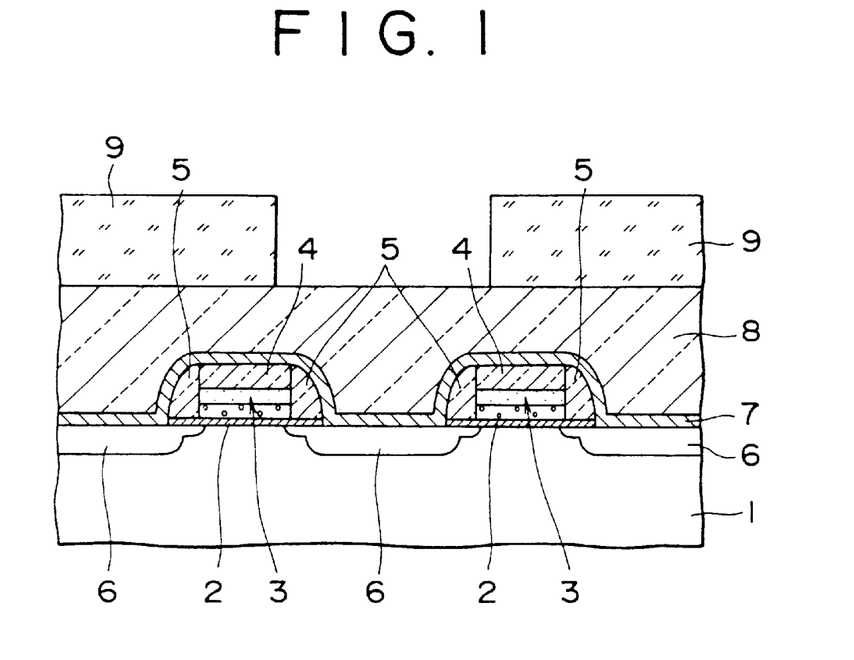
FIG. 1 is a typical sectional view of an example in which the present invention is applied to formation of a bit line contact of an SRAM on the basis of an SAC process, which particularly shows a state in which a resist patterning is completed.

First, a gate oxide film 2 ($SiO_2$) having a thickness of about 8 nm was formed by thermally oxidizing the surface of a Si substrate 1 already processed in well formation and element isolation by, for example, pyrogenic oxidation. Subsequently, a tungsten/polycide film having a thickness of about 140 nm and a SiOx film having a thickness of about 50 nm were sequentially formed by, for example, low pressure CVD, and then dry-etched through a common resist mask, to form a laminated pattern of a gate electrode 3 (poly Si/WSix) and an offset oxide film 4. The gate electrode 3 has a laminated structure of an $n^+$ type poly silicon film (poly Si) having a thickness of about 70 nm and a tungsten/silicide film (WSix) having a thickness of about 70 nm in this order from the lower side. The line width of the gate electrode 3 and an interconnection space therebetween were both set at about 0.25 μm.

An LDD region was then formed in a surface layer portion of the silicon substrate 1 by ion-implantation of $As^+$ in a low concentration using the laminated pattern as a mask. The ion-implantation condition was set as follows: an ion accelerating energy was 20 keV; and a dose was $6\times10^{12}/cm^2$. A SiOx film having a thickness of about 150 nm was then deposited over the entire surface of the substrate, and was subjected to isotropic etching-back, to form a side wall 5 on each side wall surface of the laminated pattern. Ions of As were then implanted in a high concentration using the laminated pattern and side walls 5 as a mask. The ion-implantation condition was set as follows: an ion accelerating energy was 20 keV; and a dose was $3\times10^{15}/cm^2$. Subsequently, the impurity (As) was activated by RTA (rapid thermal annealing) at 1050° C. for 10 seconds, to form a source/drain region 6 having an LDD structure.

A SiN etching stopper film 7 having a thickness of about 50 nm was formed by low pressure CVD in such a manner as to cover the entire surface of the substrate in a conformal manner. A SiOx interlayer insulating film 8 was deposited to a thickness of about 500 nm by, for example, $O_3$-TEOS normal pressure CVD, and the surface of the substrate was substantially planarized. After that, a resist pattern 9 was formed on the SiOx interlayer insulating film 8. The resist patterning was performed using a chemical amplification type positive photoresist material (produced by Wako Pure Chemical Industries, LTD. in the trade name of WKR-PT1) and a KrF excimer laser stepper, to provide an opening having a diameter of about 0.3 μm for covering an inter-connection space. FIG. 1 shows the wafer in which the above steps are completed.

The SiOx interlayer insulating film 8 was selectively etched using a commercially available magnetic field microwave plasma etcher, for example, shown in FIG. 8. The etcher is designed for etching of an SiOx film and is referred to as "ECR type oxide film etcher". The etching condition was set as follows.

flow rate of $CHF_3$: 35 SCCM flow rate of $CH_2F_2$: 15 SCCM pressure: 0.27 Pa microwave power: 1200 W (2.45 GHz)

RF bias power: 200 W (800 kHz)

wafer temperature: 30° C.

over-etching ratio: 50%

Figure 2:
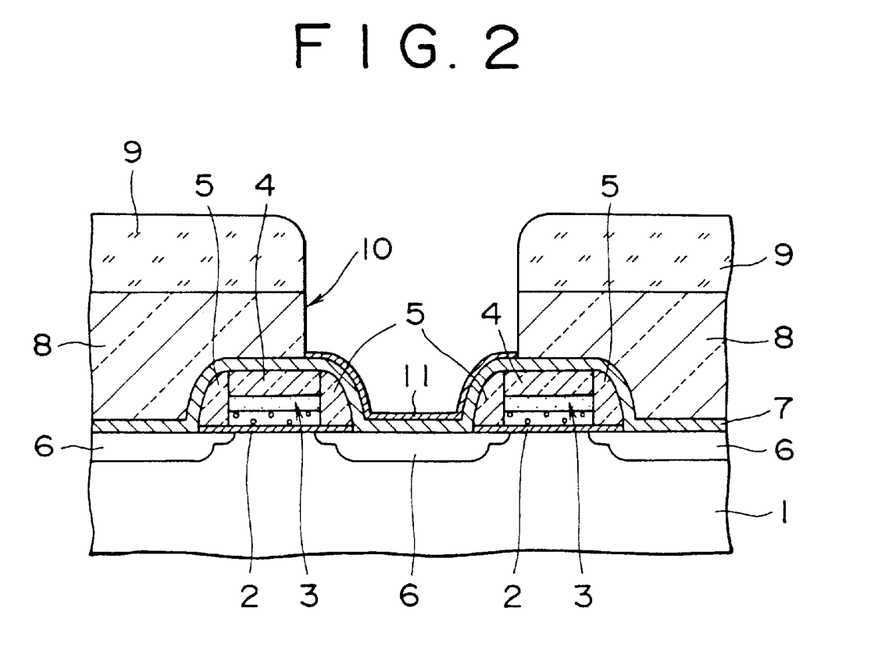
FIG. 2 is a typical sectional view showing a state in which selective dry etching of a SiOx interlayer insulating film in FIG. 1 is completed and a FC based protective film is deposited on the surface of a SiN etching stopper film.

In the above etching, anisotropic etching proceeds at a practical rate using ions generated in a sufficient amount in a high density plasma. At the same time, the FC based protective film 11 produced in the plasma is deposited on an exposed surface of the SiN etching stopper film 7 as shown in FIG. 2 and it functions to ensure a selective ratio to the underlying film, and thereby the etching rate is greatly reduced when the SiOx interlayer insulating film 8 is removed. In this way, the contact hole 10 was partially formed. The reason why the FC based protective film 11 is deposited not on the surface of the SiOx interlayer insulating film 8 but only on the surface of the SiN etching stopper film 7 and reduces the etching rate to the SiN etching stopper film 7, is that the SiN etching stopper film 7 does not discharge oxygen from the film differently from the SiOx interlayer insulating film 8 and thereby it has not a function of removing the FC based protective film 11 deposited on the surface by itself so that the deposited amount on the surface exceeds the removed amount by ion sputtering. The etching selection ratio to the SiN is about 30 at the flat portion, and is about 25 even at a corner portion being weak by ion impact.

The wafer W was then carried to a commercial available single wafer type asher, and was subjected to oxygen plasma processing in the following condition:

flow rate of $O_2$: 2000 SCCM pressure: 30 Pa

RF bias power: 1000 W (13.56 MHz)

wafer temperature: 100° C.

time: 5 seconds

Figure 3:
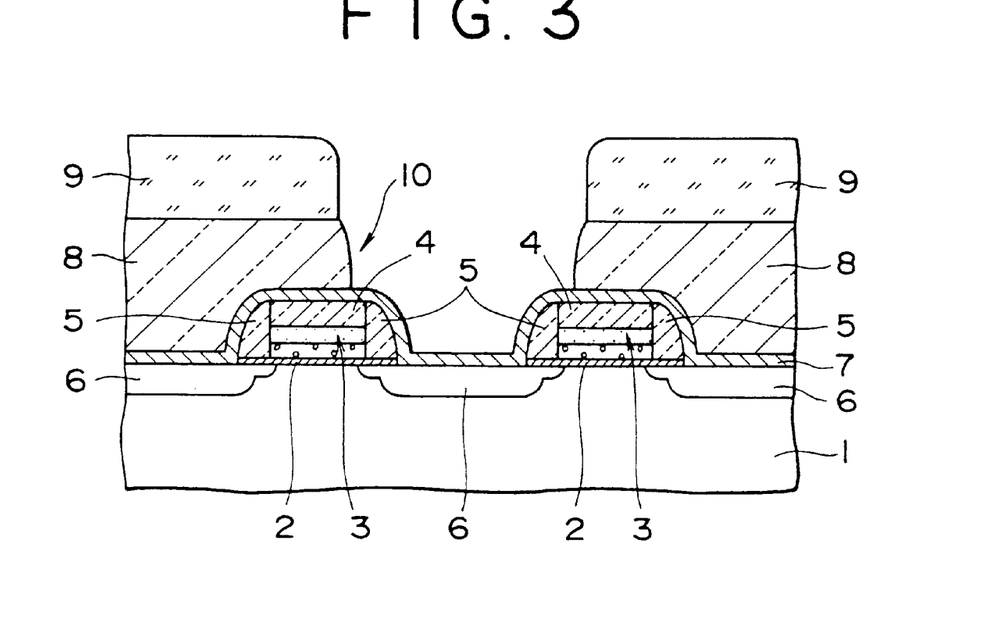
FIG. 3 is a typical sectional view showing a state in which the FC protective film in FIG. 2 is removed and the SiN etching stopper film is exposed.

In this process, the FC based protective film 11 was removed by the effect of O* (oxygen radical), so that the SiN etching stopper film 7 is exposed on the bottom surface of the contact hole 10 as shown in FIG. 3. At this time, the edge of the resist pattern 9 made of the organic film was slightly retarded; however, since the processing time is short, the increment of the resist opening diameter was only by about 10%.

The wafer W was then carried to another magnetic field microwave plasma etcher designed for etching a polysilicon film (hereinafter, referred to as "ECR type polysilicon film etcher"), to selectively remove the exposed portion of the SiN etching stopper film 7. The etching condition was set as follows:

flow rate of $CHF_3$: 50 SCCM pressure: 0.27 Pa microwave power: 1000 W (2.45 GHz)

RF bias power: 100 W (800 kHz)

wafer temperature: 30° C.

over-etching ratio: 20%

Figure 4:
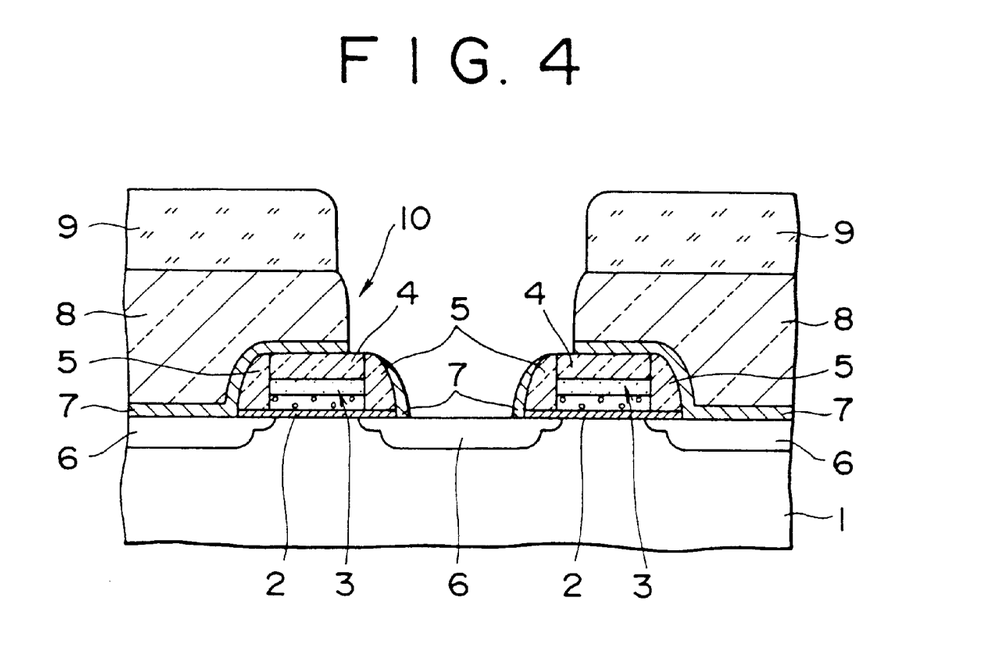
FIG. 4 is a typical sectional view showing a state in which the SiN etching stopper film in FIG. 3 is selectively dry-etched to complete a contact hole.

The above condition is set so that the depositing characteristic of the FC based polymer is made weaker than in the etching condition for the SiOx interlayer insulating film 8 and F* is produced in a large amount by accelerating the dissociation of the $CHF_3$ gas by the $O_2$ gas to ensure a selection ratio to the offset oxide film 4 and the side wall 5. With such an etching, the contact hole 10 was completed as shown in FIG. 4.

Figure 5:
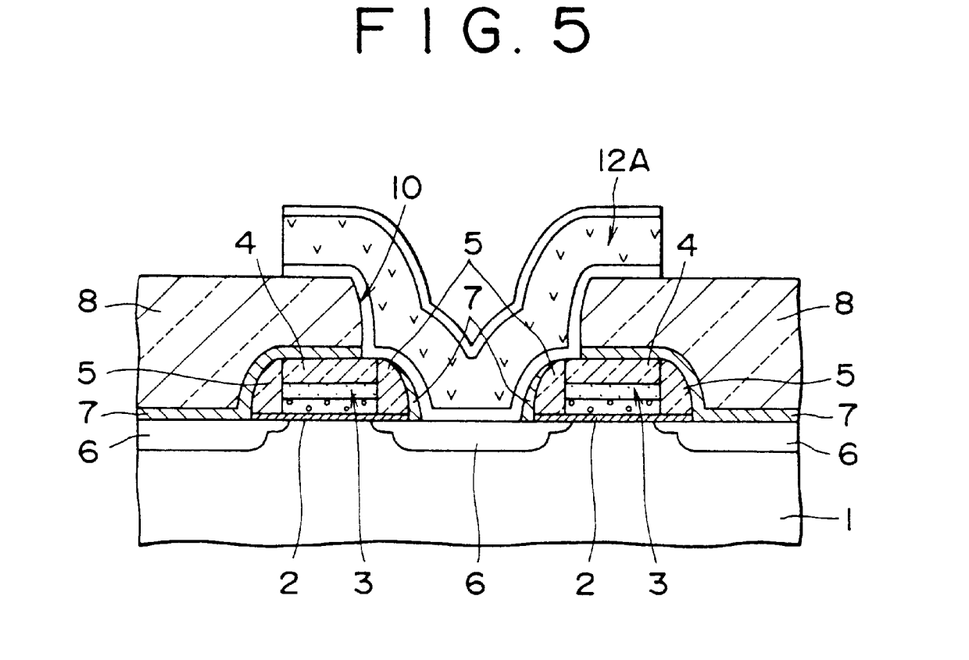
FIG. 5 is a typical sectional view showing a state in which the contact hole in FIG. 4 is buried with an upper interconnection.

After that, the resist pattern 9 was ashed, and an upper interconnection 12 (Al) made of an Al based multi-layer film was formed in such a manner as to cover the contact hole 10 as shown in FIG. 5, to complete a bit line contact. The Al based multi-layer film has, for example, a three layer structure of a Ti based adhesive layer/Al-1% Si film/TiN based reflection preventive film.

According to the present invention, the FC based protective film can be sufficiently removed before starting of dry etching of the SiN etching stopper film 7, so that a residue of the SiN etching stopper film 7 is not generated, that is, excessive over-etching for removing a residue is eliminated. A semiconductor device having a high reliability can be thus manufactured without generation of a failure in withstand voltage, short-circuit, or contact failure between the gate electrode 3 and the upper interconnection 12.

EXAMPLE 2

This example concerning an SAC process is carried out in the same manner as that in Example 1, except that the time required for the oxygen plasma processing for removal of the FC based protective film 11 is made longer than that in Example 1 and the resist pattern 9 is removed together with the FC based protective film 11.

A wafer W used as a sample in this example has the structure shown in FIG. 1, like Example 1. Here, the etching of the SiOx intelayer insulating film 8 was performed using the ECR type oxide film etcher in the same condition as that in Example 1, and the wafer W was carried in the commercial available single wafer type asher, and was subjected to ashing in the following condition:

flow rate of $O_2$: 2000 SCCM pressure: 30 Pa

RF bias power: 1000 W (13.56 MHz)

wafer temperature: 100° C.

time: 60 seconds

Figure 6:
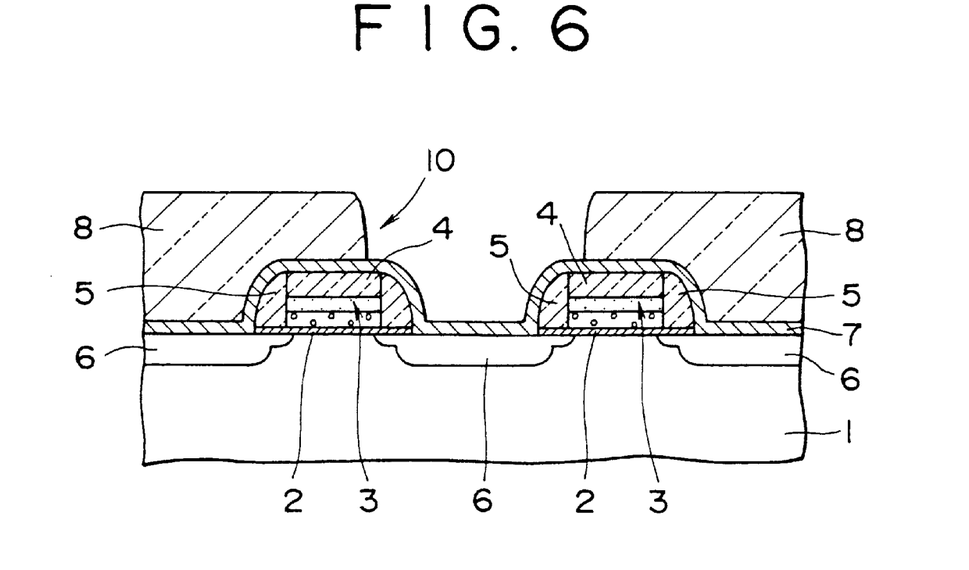
FIG. 6 is a typical sectional view of another example the present invention is applied to formation of a bit line contact of an SRAM based on an SAC process, which shows a state in which a FC protective film and a resist pattern are simultaneously removed.

As a result, the FC based protective film 11 and the resist pattern 9 were simultaneously removed as shown in FIG. 6, and thereby the SiN etching stopper film 7 was exposed on the bottom of the contact hole.

Figure 7:
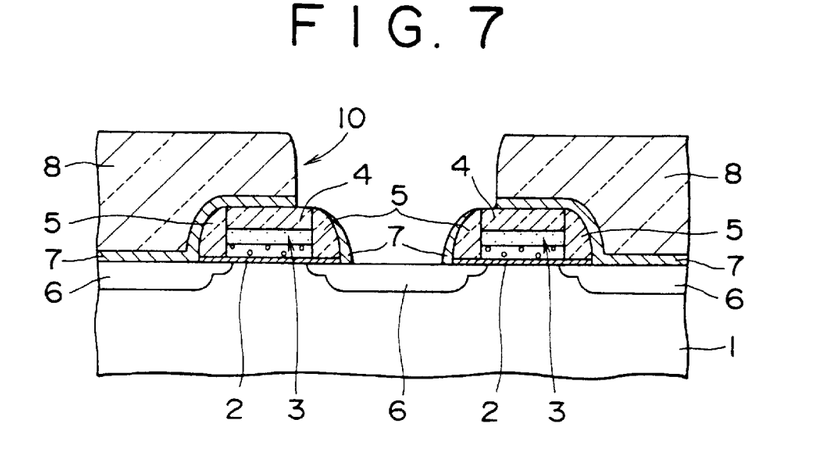
FIG. 7 is a typical sectional view showing a state in which the SiN etching stopper film in FIG. 6 is selectively dry-etched to complete a contact hole.

The wafer W was then carried to the ECR type polysilicon film etcher, and the SiN etching stopper film 7 was selectively removed in the same condition as in Example 1, to complete the contact hole 10 as shown in FIG. 7. The upper interconnection 12 was then buried in the contact hole 10. Even in this example, a semiconductor device having a high reliability can be manufactured without generation of a failure in withstand voltage, short-circuit, or contact failure between the gate electrode 3 and the upper interconnection 12.

In this example, the Si substrate 1 is not exposed upon resist ashing, differently from Example 1 in which the resist ashing is performed after removal of the SiN etching stopper film, and consequently any oxide film is not formed on the Si exposed surface by ashing. Accordingly, the upper interconnection 12 can be buried directly after completion of the contact hole 10 so long as the growth of the natural oxide film is suppressed, to thereby improve the throughput.

EXAMPLE 3

In this example, the dry etching of the SiOx interlayer insulating film and the removal of the FC based protective film are performed using a common chamber.

A wafer W used as a sample in this example has the structure shown in FIG. 1, like Example 1. Here, the etching of the SiOx interlayer insulating film 8 was performed using the ECR type oxide film etcher in the same condition as in Example 1, and the FC based protective film 11 was removed in a state in which the wafer W was held in the same chamber. The discharge condition in this case was set as follows:

flow rate of $O_2$: 20 SCCM pressure: 0.27 Pa microwave power: 1000 W (2.45 GHz)

RF bias power: 80 W (800 kHz)

wafer temperature: 30° C.

time: 5 seconds

With this plasma processing, the FC based protective film 11 was removed and the SiN etching stopper film 7 was exposed on the bottom of the contact hole, like Example 1. At the same time, the edge of the resist pattern 9 was slightly restarted; however, since the etching time was short, an increment of the opening diameter was only about 10%. The wafer W was then carried in the ECR type polysilicon film etcher, and the SiN etching stopper film 7 was selectively removed in the same condition as in Example 1 and the upper interconnection 12 was buried in the contact hole 12 completed through resist ashing. Even in this example, a semiconductor device having a high reliability can be manufactured without generation of a failure in withstand voltage, short-circuit, or contact failure between the gate electrode 3 and the upper interconnection 12.

EXAMPLE 4

In this example, the dry etching of the SiOx interlayer insulating film and the removal of the FC based protective film are performed in the same chamber, like Example 3, and the resist pattern is removed together with the FC based protective film.

A wafer W used as a sample in this example has the structure shown in FIG. 1. The etching of a SiOx interlayer insulating film 8 was performed using the ECR type oxide film etcher in the same condition as in Example 1, and the ashing was performed in a state in which the wafer W was held in the same chamber. The ashing condition was set as follows:

flow rate of $O_2$: 20 SCCM pressure: 0.27 Pa microwave power: 1000 W (2.45 GHz)

RF bias power: 80 W (800 kHz)

wafer temperature: 30° C.

time: 60 seconds

As a result, as shown in FIG. 6, the FC protective film 11 and the resist pattern 9 were simultaneously removed, and the SiN etching stopper film 7 was exposed on the bottom of the contact hole.

The wafer W was then carried in the ECR type polysilicon film etcher, and the SiN etching stopper film 7 was selectively removed in the same condition as in Example 1, to complete the contact hole 10 shown in FIG. 7. The contact hole 10 was buried with the upper interconnection 12. Even in this example, a semiconductor device having a high reliability can be manufactured at a high throughput without generation of a failure in withstand voltage, short-circuit, or contact failure between the gate electrode 3 and the upper interconnection 12.

EXAMPLE 5

In this example, the dry etching of the SiOx interlayer insulating film is performed using the ICP etcher and then the FC protective film and the SiN etching stopper film are simultaneously removed using another ICP etcher.

A wafer W used as a sample in this example has the structure shown in FIG. 1. The etching of the SiOx interlayer insulating film 8 was performed using the ICP etcher designed for etching for the SiOx film. The etcher has the structure shown in FIG. 9. The etching condition was set as follows:

flow rate of $C_3F_8$: 20 SCCM flow rate of Ar: 40 SCCM pressure: 0.27 Pa source power: 2000 W (2 MHz)

RF bias power: 1000 W (1.8 MHz)

upper electrode temperature: 250° C.

wafer temperature: 30° C.

over-etching ratio: 50%

Thus, as shown in FIG. 2, anisotropic etching of the SiOx interlayer insulating film 8 was performed while achieving a high selection ratio (about 30) to the SiN etching stopper film 7 by the effect of the FC based protective film 11, like Example 1.

The wafer W was then carried in the ICP etcher for polysilicon film etching, to simultaneously remove the FC based protective film 11 and the SiN etching stopper film 7. The etching condition was set as follows:

flow rate of $CHF_3$: 50 SCCM flow rate of $O_2$: 30 SCCM pressure: 0.27 Pa source power: 1500 W (2 MHz)

RF bias power: 800 W (1.8 MHz)

upper electrode temperature: 250° C.

wafer temperature: 30° C.

over-etching ratio: 20%

In this process, O* (oxygen radical) as an etching species for the FC based protective film 11 and F* and $CFx^+$ as an etching species for the SiN etching stopper film 7 are simultaneously produced in the plasma, so that the FC protective film 11 is first removed and subsequently the selective etching of the SiN etching stopper film 7 proceeds. Of course, the FC based polymer produced during the etching of the SiN etching stopper film 7 is immediately removed. As a result, the SiN etching stopper film 7 is removed without generation of any residue. A semiconductor device having a high reliability can be thus manufactured, like the previous examples.

EXAMPLE 6

In this example, the dry etching of a SiOx interlayer insulating film is performed using the helicon wave plasma etcher, and the FC based protective film is simultaneously removed upon plasma discharge for removing residual charges of the single electrode type electrostatic chuck used for holding the wafer. The SiN etching stopper film is also etched using another helicon waver plasma etcher.

A sample wafer W used as a sample in this example has the structure shown in FIG. 1. The etching of the SiOx interlayer insulating film was performed using the helicon wave plasma etcher designed for etching of a SiOx film. The etcher has the structure shown in FIG. 10.

In addition, the electrostatic chuck used in this example is of a single electrode type in which a direct current having a specified polarity is applied to a single inner electrode buried in an insulating member and the wall of a plasma chamber through plasma is taken as a counter earth. In the case of using such a single type electrostatic chuck, charges remain even by stopping the supply of the direct current after completion of dry etching, and accordingly a plasma must be excited again to discharge residual charges through the plasma before removing the wafer W from the wafer stage 69. The plasma for discharge residual charges is generally excited by supplying a gas substantially not exerting any effect on the result obtained by the previous plasma processing. In this example, $O_2$ for generating an etching species for the FC based protective film is used as such a gas.

The dry etching for the SiOx interlayer insulating film 8 was set as follows:

flow rate of $c-C_4F_8$: 50 SCCM flow rate of Ar: 200 SCCM pressure: 0.27 Pa source power: 2500 W (13.56 MHz)

RF bias power: 200 W (400 kHz)

wafer temperature: 30° C.

over-etching ratio: 50%

Thus, as shown in FIG. 2, anisotropic etching of the SiOx interlayer insulating film 8 was performed while achieving a high selection ratio (about 30) to the SiN etching stopper film 7 by the effect of the FC based protective film 11, like Example 1.

The discharge for removing residue charges of the single electrode type electrostatic chuck and the FC based protective film 11 was performed in the following condition:

flow rate of $O_2$: 30 SCCM pressure: 0.27 Pa microwave power: 1500 W (13.56 MHz)

RF bias power: 100 W (400 kHz)

wafer temperature: 30° C.

time: 10 seconds

As a result, the FC based protective film 11 was removed, and the SIN etching stopper film 7 was exposed on the bottom of the contact hole as shown in FIG. 3. An increment of the opening diameter of the resist pattern 9 was only about 10%. Such a process in which the removal of the FC based protective film 11 serves as the removal of the residue charges of the electrostatic chuck improves the throughput.

The wafer W was then carried in another helicon wave plasma etcher for etching of a polysilicon film, and the SiN etching stopper film 7 was selectively dry-etched in the following condition:

flow rate of $CHF_3$: 50 SCCM pressure: 0.27 Pa source power: 1500 W (13.56 MHz)

RF bias power: 200 W (400 kHz)

wafer temperature: 30° C.

over-etching ratio: 20%

As a result, such a contact shape as to eliminate generate short-circuit of interconnection and generation of any residue was obtained. After that, the resist pattern 9 was removed by ashing and the upper interconnection 12 was formed, like the previous examples.

In the etching of the SiN etching stopper film 7, $O_2$ may be added in the gas in an amount of, for example, about 20 SCCM. If the FC based protective film 11 slightly remains, the SiN etching stopper film 7 can etched while perfectly removing the FC based protective film 11 using the gas containing $O_2$ in the same mechanism as described in Example 3.

Although the present invention has been described with respect to the above six examples, such description is only illustrative purposes. The above examples, for example, have described the use of a common chamber for the dry etching of the SiOx interlayer insulating film and the removal of the FC based protective film (or added with the resist pattern); and also the use of a common chamber for the removal of the FC based protective film and the dry etching of the SiN etching stopper film. The reason why the use of a common chamber only for the continuous two steps has been described is that the usual etcher has a design optimized for its application and the etcher is independently designed, for example, an oxide film etcher or polysilicon film etcher. However, for an etcher contrived in a gas supply system or an in-chamber cleaning means, all of the steps, dry etching of the SiOx interlayer insulating film, removal of the FC based protective film (or added with removal of the resist pattern) and dry etching of the SiN etching stopper film can be of course performed using a common chamber.

The details in the design rule, the configuration of a sample wafer, the kind and the structure of an etcher used, the dry etching condition, the oxygen plasma processing condition and the like can be of course suitably changed or selected.

What is claimed is:

1. A method for making a connection hole, comprising the steps of:

providing a silicon substrate having a surface including a pair of spaced apart electrodes, each electrode including a lower gate oxide film layer disposed on said surface and an upper gate electrode disposed on said lower gate oxide film layer, upper and side surfaces of each electrode being covered by an offset oxide film and sidewall, respectively, said substrate further including source and drain regions having an LDD structure defined in the substrate adjacent said electrodes;

depositing an etching stopper film comprising an SiN based material on said offset oxide film, said sidewalls and any remaining exposed portions of said substrate surface;

depositing an interlayer insulating film comprising an $SiO_x$ based material on said etching stopper film;

depositing an organic film on said interlayer insulating film and patterning the organic film to define a connection hole pattern between said electrodes;

anisotropically etching said interlayer insulating film using the organic film as a mask by plasma processing in an ECR oxide film etcher with a fluorocarbon (FC)-based gas to selectively remove portions of the interlayer insulating film to partially define a connection hole and simultaneously deposit an FC based protective film only on said etching stopper film;

removing said FC based protective film by only oxygen plasma processing in an asher; and thereafter, removing portions of said etching stopper film by plasma processing in an ECR polysilicon film etcher with a fluorocarbon based gas to provide an anisotropically selectively etched connection hole extending through said interlayer insulating film and said etching stopper layer to an exposed surface portion of said substrate surface.

2. A method for making a connection hole as defined in claim 1, wherein in said removing step, the organic film is removed concurrently with the FC based protective film.

* * * * *